(12) United States Patent
Kahn

(10) Patent No.: US 12,136,332 B2
(45) Date of Patent: Nov. 5, 2024

(54) BLOCKED VENT SENSOR FOR ELECTRONIC DEVICES

(71) Applicant: ARRIS Enterprises LLC, Suwanee, GA (US)

(72) Inventor: Michael Kahn, Cherry Hill, NJ (US)

(73) Assignee: ARRIS ENTERPRISES LLC, Horsham, PA (US)

( * ) Notice: Subject to any disclaimer, the term of this patent is extended or adjusted under 35 U.S.C. 154(b) by 0 days.

(21) Appl. No.: 17/723,832

(22) Filed: Apr. 19, 2022

(65) Prior Publication Data

US 2022/0392328 A1    Dec. 8, 2022

Related U.S. Application Data

(60) Provisional application No. 63/208,230, filed on Jun. 8, 2021.

(51) Int. Cl.

| | |
|---|---|
| *G08B 21/18* | (2006.01) |
| *G01K 3/00* | (2006.01) |
| *H05K 5/02* | (2006.01) |
| *H05K 7/20* | (2006.01) |

(52) U.S. Cl.
CPC .......... *G08B 21/182* (2013.01); *G01K 3/005* (2013.01); *H05K 5/0213* (2013.01); *H05K 7/20136* (2013.01); *H05K 7/20209* (2013.01)

(58) Field of Classification Search
CPC .... G08B 21/182; G01K 3/005; H05K 5/0213; H05K 7/20136; H05K 7/20209
USPC .......................................................... 340/606
See application file for complete search history.

(56) References Cited

U.S. PATENT DOCUMENTS

| | | | | |
|---|---|---|---|---|
| 10,372,575 | B1 * | 8/2019 | North | G06F 11/24 |
| 10,519,960 | B2 * | 12/2019 | Kelly | G06F 1/20 |
| 10,754,399 | B2 * | 8/2020 | Seyed | G06F 3/011 |
| 10,848,625 | B1 * | 11/2020 | Pugh | H04N 1/00814 |
| 10,957,175 | B2 * | 3/2021 | Orr | G01V 8/20 |

(Continued)

OTHER PUBLICATIONS

International Search Report and the Written Opinion of the International Searching Authority dated Aug. 12, 2022 in International (PCT) Application No. PCT/US2022/025314.

(Continued)

*Primary Examiner* — Zhen Y Wu
(74) *Attorney, Agent, or Firm* — Wenderoth, Lind & Ponack, L.L.P.

(57) ABSTRACT

An electronic device includes proximity sensor, a memory and a processor. The proximity sensor is positioned within an enclosure of the electronic proximate to one or more air vents. The proximity sensor generates a sensing signal to detect blockage of the one or more air vents. Based on a response to the sensing signal, the proximity sensor generates an output signal indicating that one or more air vents is blocked. The processor is configured to execute computer-readable instructions stored in memory to receive the output signal from the proximity sensor indicating blockage of the one or more air vents is detected, and, in response to receiving the output signal from the proximity sensor indicating blockage of the one or more air vents is detected, forward, to one of a network device, a user device, and a service provider, a notification of the blockage of the one or more air vents.

20 Claims, 10 Drawing Sheets

(56) References Cited

U.S. PATENT DOCUMENTS

| | | | | |
|---|---|---|---|---|
| 2003/0002250 A1* | 1/2003 | Yin | G06F 1/181 | 361/679.48 |
| 2005/0223515 A1* | 10/2005 | Kiern | A47L 9/2821 | 15/339 |
| 2008/0002156 A1* | 1/2008 | Hsu | G03B 21/16 | 353/57 |
| 2010/0321873 A1* | 12/2010 | Joshi | G06F 1/20 | 361/679.5 |
| 2012/0130545 A1* | 5/2012 | Haugh | G06F 1/203 | 700/276 |
| 2012/0241140 A1* | 9/2012 | MacDonald | G06F 1/206 | 165/278 |
| 2012/0243149 A1* | 9/2012 | Gartrell | G06F 1/1654 | 361/679.01 |
| 2015/0204758 A1* | 7/2015 | Schnell | G06Q 10/20 | 73/114.37 |
| 2015/0373877 A1* | 12/2015 | Ragupathi | H05K 7/20836 | 361/679.48 |
| 2016/0124399 A1* | 5/2016 | Su | G05B 11/01 | 700/275 |
| 2018/0280855 A1* | 10/2018 | Sasaki | G01N 15/082 | |
| 2019/0011965 A1* | 1/2019 | Seyed | G06F 1/206 | |
| 2019/0033897 A1* | 1/2019 | Barbier | G06F 1/206 | |
| 2019/0124795 A1* | 4/2019 | Dayal | H05K 7/20736 | |
| 2019/0235982 A1* | 8/2019 | North | G06F 1/203 | |
| 2020/0173679 A1* | 6/2020 | O'Reilly | F24F 11/38 | |
| 2020/0333861 A1* | 10/2020 | Seyed | G06F 1/324 | |
| 2020/0390309 A1* | 12/2020 | Zhu | A47L 11/4094 | |
| 2021/0357011 A1* | 11/2021 | Li | G06F 1/206 | |

OTHER PUBLICATIONS

International Preliminary Report on Patentability issued Nov. 21, 2023 in corresponding International (PCT) Application No. PCT/US2022/025314.

* cited by examiner

BLOCKED VENT SENSOR FOR ELECTRONIC DEVICES

BACKGROUND

The subject matter of the present disclosure relates generally to using one or more proximity sensors to determine when an air vent of an enclosure of an electronic device is blocked.

Electronic devices, such as set-top boxes, routers, cable modems, etc., may have one or more vents or ducts in an enclosure or case of the device, where air enters, and air exits the enclosure. For example, air may enter at the bottom of the device and exit at the top of the device. Fans are used to maintain airflow to keep the devices cool. In addition to fans, many of these devices, especially cable modems, have one or more temperature sensors that monitor the ambient temperature and the temperature of internal components, such as the processor, communications module, etc. If it is determined that a device is running hot, telemetry may be used to report the issue to the operator.

However, there are numerous situations where devices are not installed properly. For example, a user may place a pillow on top of the device. Also, a soft object, such as a blanket or a pet may be on top of the device. The device may also be placed on a soft surface, such as a plush rug or carpet, and the air entry vents may become blocked. Because the air entry vents and/or air exit vents may become blocked, heat may build-up inside the enclosure of the device even though the fan is working properly.

SUMMARY

An aspect of the present disclosure involves a system and method to using one or more proximity sensors to determine when an air vent of an enclosure of an electronic device is blocked.

An electronic device includes at least one proximity sensor, a memory and a processor. The at least one proximity sensor is positioned within an enclosure of the electronic proximate to one or more air vents. The at least one proximity sensor generates a sensing signal to detect blockage of the one or more air vents. Based on a response to the sensing signal, the proximity sensor generates an output signal indicating that one or more air vents is blocked. The processor is configured to execute computer-readable instructions stored in memory to receive the output signal from the proximity sensor indicating blockage of the one or more air vents is detected, and, in response to receiving the output signal from the proximity sensor indicating blockage of the one or more air vents is detected, forward, to one of a network device, a user device, and a service provider, a notification of the blockage of the one or more air vents.

The electronic device may include a fan for circulating air to cool the inside of the enclosure, wherein the one or more air vents includes an intake vent and an exhaust vent, the at least one proximity sensor may include a first proximity sensor proximate to the intake vent and a second proximity sensor proximate the exhaust vent, wherein the fan pulls air in through the intake vent and pushes air out of the exhaust vent, and wherein the processor receives the output signal from one of the first proximity sensor detecting blockage of the intake vent and the second proximity sensor detecting blockage of the exhaust vent.

When the notification is forwarded to the service provider, the processor receives an alert from the service provider describing information about the one or more air vents being blocked, and forwards, the alert to a user device including instructions to check the one or more air vents for blockage; and When the notification is forwarded to the user device, the processor sends the user device an alert describing information about the one or more air vents being blocked and including instructions to check the one or more air vents for blockage.

The processor receives a user response from the user device indicating the blockage associated with the one or more air vents has been resolved, and the user response is forwarded to the service provider.

When the processor fails to receive the user response within a predetermined time, the processor initiates a cooling action until the output signal from the proximity sensor indicates the one or more air vents are no longer blocked.

The electronic device may include a temperature sensor, wherein the notification includes information associated with one or more of an internal temperature that exceeds a first predetermined temperature threshold measured within the enclosure by the temperature sensor and a temperature of a component within the enclosure measured by the temperature sensor that exceeds a second predetermined temperature threshold.

The notification is forwarded using one or more of a Wi-Fi signal forwarded over a Wi-Fi network, a radio frequency (RF) signal forwarded over an RF network, an RF satellite signal forwarded through a communication satellite, a POST request message forwarded over a network to a destination address, and a JSON (JavaScript Object Notation) message forwarded over a network to the destination address.

BRIEF SUMMARY OF THE DRAWINGS

The accompanying drawings, which are incorporated in and form a part of the specification, illustrate examples of the subject matter of the present disclosure and, together with the description, serve to explain the principles of the present disclosure. In the drawings.

DETAILED DESCRIPTION

The following detailed description is made with reference to the accompanying drawings and is provided to assist in a comprehensive understanding of various example embodiments of the present disclosure. The following description includes various details to assist in that understanding, but these are to be regarded merely as examples and not for the purpose of limiting the present disclosure as defined by the appended claims and their equivalents. The words and phrases used in the following description are merely used to enable a clear and consistent understanding of the present disclosure. In addition, descriptions of well-known structures, functions, and configurations may have been omitted for clarity and conciseness.

Figure 1:
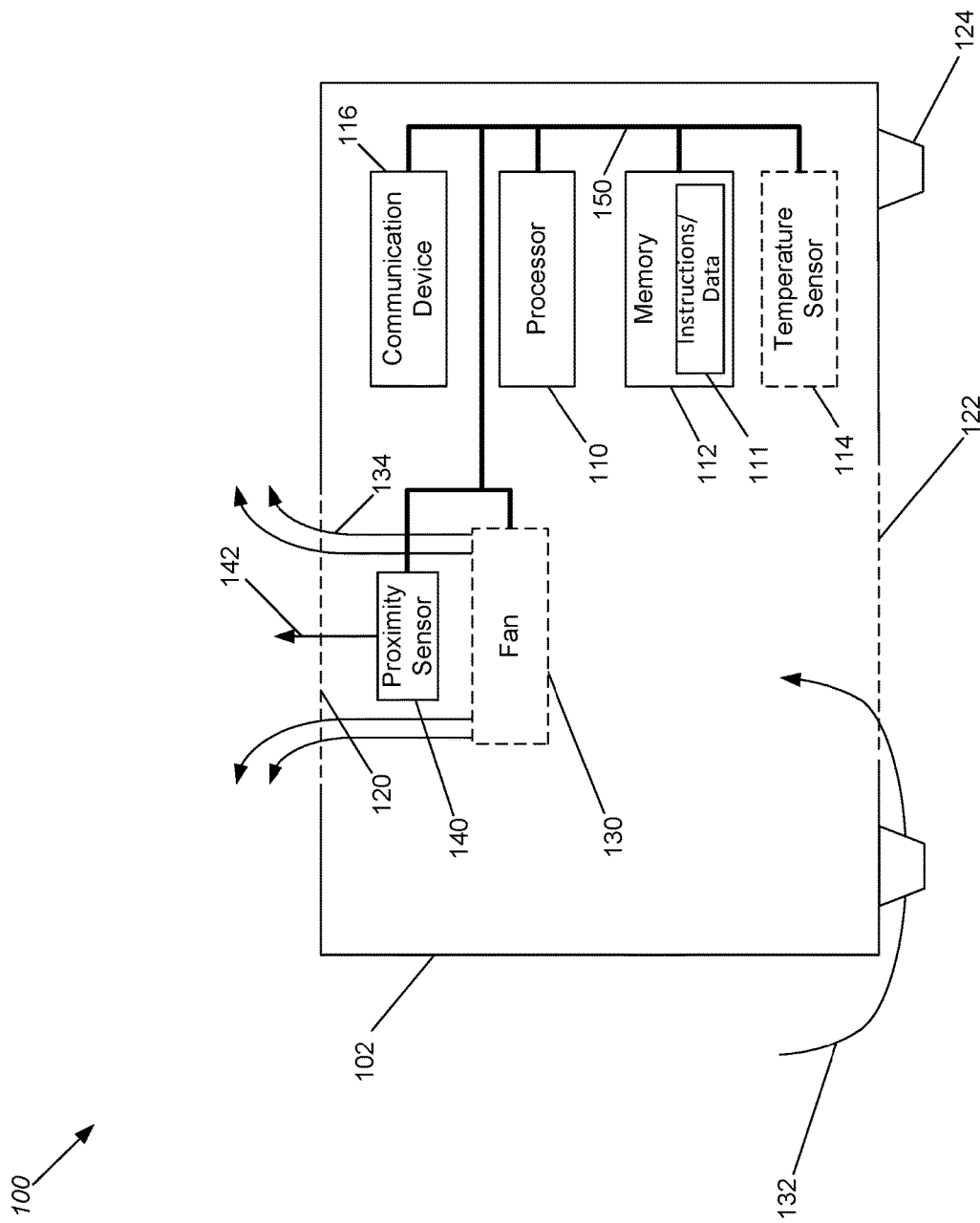
FIG. 1 illustrates an electronic device.

FIG. 1 illustrates an electronic device 100.

In FIG. 1, the electronic device 100 includes an enclosure 102. A processor executes instructions 111 stored in memory 112. The electronic device 100 may also include a temperature sensor 114. Temperature sensor 114 may be used to determine whether the temperature inside the enclosure 102 exceeds a threshold or whether a specific device, e.g., processor 110, fan 130, communication device 116, etc., begins to overheat and exceeds a temperature threshold. However, the electronic device 100 may not include a temperature sensor 114.

A communication device 116 may be used to communicate with a service provider, a gateway/cable modem/router, and/or a user device. Communication device 116 may provide wired communication or wireless communication. For example, communication device 116 may support a wireless connection in accordance with any IEEE 802.11 Wi-Fi protocols, Bluetooth protocols, Bluetooth Low Energy (BLE), or other short-range protocols that operate in accordance with a wireless technology standard for exchanging data over short distances using any licensed or unlicensed band such as the citizens broadband radio service (CBRS) band, 2.4 GHz bands, 5 GHz bands, 6 GHz bands, 60 GHz, etc. Additionally, communication device 116 can support a wireless connection that operates in accordance with, but is not limited to, Radio Frequency for Consumer Electronics (RF4CE) protocol, ZigBee protocol, Z-Wave protocol, or IEEE 802.15.4 protocol. It is also contemplated by the present disclosure that connections 560, 562 can include connections to a media over coax (MoCA) network. Communication device 116 may also support a wired Ethernet connection.

Communication device 116 may also be connected to a network, which may include a wide area network (WAN), a virtual private network (VPN), metropolitan area networks (MANs), system area networks (SANs), a DOCSIS (Data Over Cable Service Interface Specification) network, a fiber optics network (e.g., FTTH (fiber to the home) or FTTX (fiber to the x), or hybrid fiber-coaxial (HFC)), a digital subscriber line (DSL), a public switched data network (PSDN), a global Telex network, or a 2G, 3G, 4G or 5G network, for example. Communication device 116 may further be connected with a service provider through a broadband mobile phone network connection, an optical network connection, or other similar connections. For example, communication device 116 can also be implemented using a fixed wireless connection that operates in accordance with, but is not limited to, 3rd Generation Partnership Project (3GPP) Long Term Evolution (LTE) or 5G protocols.

The enclosure 102 may include one or more air vents, such as top vent 120 and bottom vent 122. Top vent 120 may be an exhaust vent and bottom vent 122 may be an intake vent. However, one or more air vents 120, 122 may be provided on each side of enclosure 102, on a same side of enclosure 102, only on the top or bottom of enclosure 102. Enclosure 102 may include feet 124 to raise enclosure so that air may enter through bottom vent 122.

The electronic device 100 may include one or more fans 130. Fan 130 may draw air in 132 through the bottom vent 122 and push air out 134 of top vent 120. Alternatively, fan 130 may include a first to draw air in 132 through the bottom vent 122 and a second fan to push air out 134 of top vent 120.

A proximity sensor 140 is used to determine when the one or more air vents 120, 122 are blocked. For example, in FIG. 1 proximity sensor emits a sensing signal 142 toward the top air vent 120. Because top vent 120 is not blocked, proximity sensor 140 does not provide an indication to processor 110 that the one or more air vents 120, 122 are blocked. Other causes for exceeding the temperature threshold are examined when proximity sensor 140 does not provide an indication to processor 110 that the one or more air vents 120, 122 are blocked.

Sensing signal 142 may be any type of signal, such as sound, light, infrared radiation (IR), or an electromagnetic field. Detection by the proximity sensor 140 may be based on a first energy level when the one or more air vents 120, 122 are not blocked and a second energy level greater than a predetermined value when the one or more air vents 120, 122 are blocked. A bus 150 connects processor 110, memory 112, temperature sensor 114, communication device 116, fan 130 and proximity sensor 140. Processor 110 may thus control operation of temperature sensor 114, communication device 116, fan 130 and proximity sensor 140.

Figure 2:
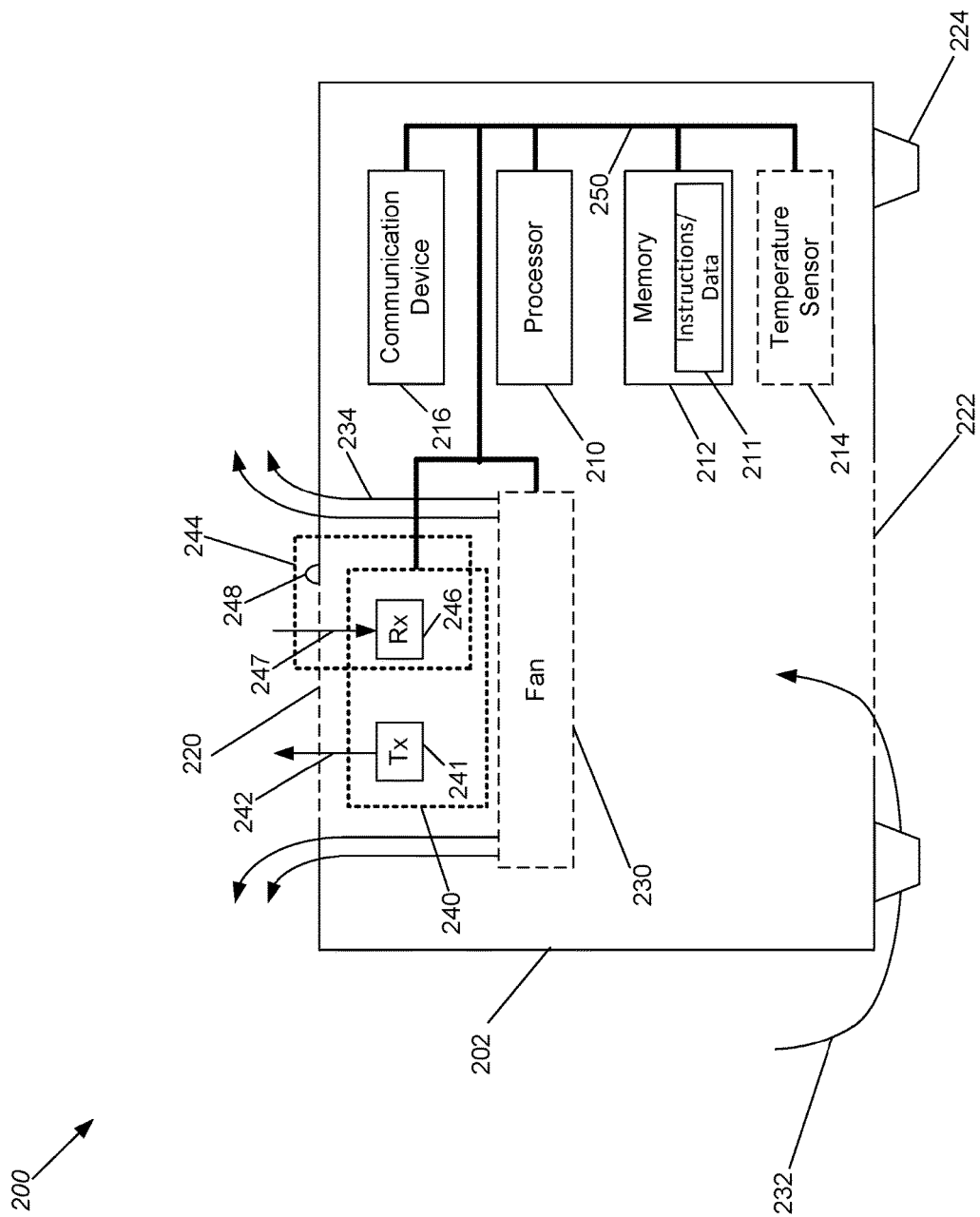
FIG. 2 illustrates details of a proximity sensor of an electronic device.

FIG. 2 illustrates details of a proximity sensor of an electronic device 200.

In FIG. 2, the electronic device 200 includes an enclosure 202. A processor executes instructions 211 stored in memory 212. The electronic device 200 may also include a temperature sensor 214. Temperature sensor 214 may be used to determine whether the temperature inside the enclosure 202 exceeds a threshold or whether a specific device, e.g., processor 210, fan 230, communication device 216, etc., begins to overheat and exceeds a temperature threshold. However, the electronic device 200 may not include a temperature sensor 214.

A communication device 216 may be used to communicate with a service provider, a gateway/cable modem/router, and/or a user device. Communication device 216 may provide wired communication or wireless communication. For example, communication device 216 may support a wireless connection in accordance with any IEEE 802.11 Wi-Fi protocols, Bluetooth protocols, Bluetooth Low Energy (BLE), or other short-range protocols that operate in accordance with a wireless technology standard for exchanging data over short distances using any licensed or unlicensed band such as the citizens broadband radio service (CBRS) band, 2.4 GHz bands, 5 GHz bands, 6 GHz bands, 60 GHz, etc. Additionally, communication device 216 can support a wireless connection that operates in accordance with, but is not limited to, Radio Frequency for Consumer Electronics (RF4CE) protocol, ZigBee protocol, Z-Wave protocol, or IEEE 802.15.4 protocol. It is also contemplated by the present disclosure that connections 560, 562 can include connections to a media over coax (MoCA) network. Communication device 216 may also support a wired Ethernet connection.

Communication device 216 may also be connected to a network, which may include a wide area network (WAN), a virtual private network (VPN), metropolitan area networks (MANs), system area networks (SANs), a DOCSIS (Data Over Cable Service Interface Specification) network, a fiber optics network (e.g., FTTH (fiber to the home) or FTTX (fiber to the x), or hybrid fiber-coaxial (HFC)), a digital subscriber line (DSL), a public switched data network (PSDN), a global Telex network, or a 2G, 3G, 4G or 5G network, for example. Communication device 216 may further be connected with a service provider through a broadband mobile phone network connection, an optical network connection, or other similar connections. For example, communication device 216 can also be implemented using a fixed wireless connection that operates in accordance with, but is not limited to, 3rd Generation Partnership Project (3GPP) Long Term Evolution (LTE) or 5G protocols.

The enclosure 202 may include one or more air vents, such as top vent 220 and bottom vent 222. Top vent 220 may be an exhaust vent and bottom vent 222 may be an intake vent. However, one or more air vents 220, 222 may be provided on each side of enclosure 202, on a same side of enclosure 202, only on the top or bottom of enclosure 202. Enclosure 202 may include feet 224 to raise enclosure so that air may enter through bottom vent 222. The electronic device 200 may include one or more fans 230. For example, fan 230 may draw air in 232 through the bottom vent 222 and push air out 234 of top vent 220. Alternatively, fan 230 may include a first fan to draw air in 232 through the bottom vent 222 and a second fan to push air out 234 of top vent 220.

In FIG. 2, a first proximity sensor 240 and a second proximity sensor 244 are shown for explanation, although only one of first proximity sensor 240 and second proximity sensor 244 are needed. First proximity sensor 240 includes a transmitter/emitter 241 that emits a sensing signal 242 toward the top vent 220. Sensing signal 242 may be any type of signal, such as sound, light, infrared (IR), or an electromagnetic field. First proximity sensor 240 also includes a receiver/detector 246 that detects whether the top air vent 220 is blocked based on a response 247 to sensing signal 242. Because top vent 220 is not blocked, proximity sensor 240 does not provide an indication to processor 210 that the one or more air vents 220, 222 are blocked. Detection by the receiver/detector 246 of proximity sensor 240 may be based on a first energy level when the one or more air vents 220, 222 are not blocked and a second energy level greater than a predetermined value when the one or more air vents 220, 222 are blocked.

Second proximity sensor 244 includes a transmitter/emitter 248 that emits a sensing signal 242 outward from the enclosure 202. Transmitter/emitter 248 may be an LED that is visible on the surface of enclosure 202. Transmitter/emitter 248 may be controlled by processor 210 or may be an LED that repurposed for detection of whether the top vent 220 is blocked. For example, transmitter/emitter 248 may be an LED that is lit when the electronic device 200 is powered on. Receiver/detector 246 may determine whether the top vent 220 is blocked based on a reflection of the LED signal, which may be visible, IR, sound, etc. Detection may also be based on receiver/detector 246 measuring a first energy level when the one or more air vents are not blocked and a second energy level greater than a predetermined value when the one or more air vents are blocked. Also, as stated above, one or more air vents 220, 222 may be provided on each side of enclosure 202, on a same side of enclosure 202, only on the top or bottom of enclosure 202, and proximity sensors 240, 244 may be configured to detect blockage of the one or more air vents 220, 222 regardless of their location.

Like the electronic device 100 illustrated in FIG. 1, the electronic device 200 of FIG. 2 includes a bus 250 that connects processor 210, memory 212, temperature sensor 214, communication device 216, fan 230 and proximity sensors 240, 244. Processor 210 may thus control operation of temperature sensor 214, communication device 216, fan 230 and proximity sensors 240, 244.

Figure 3:
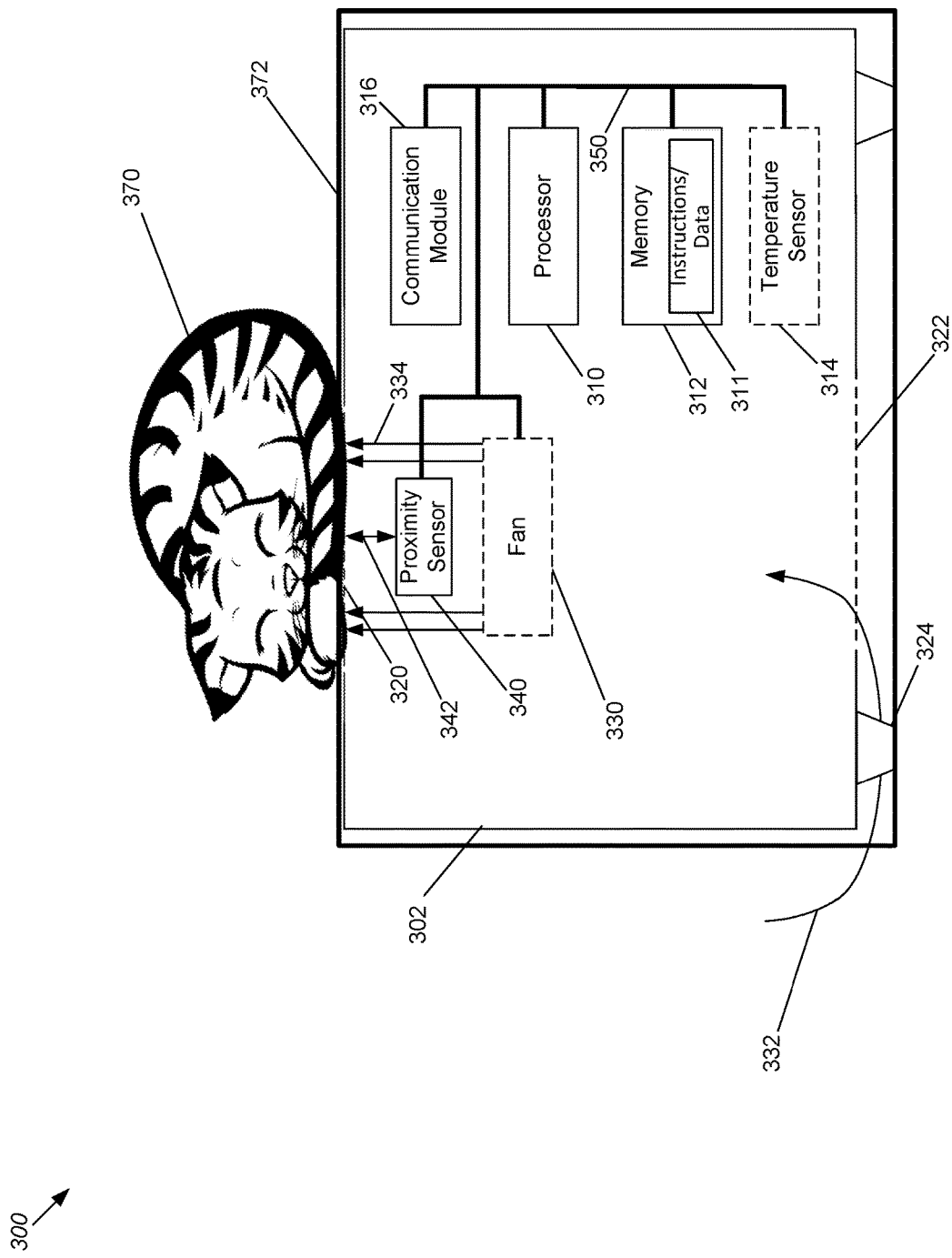
FIG. 3 illustrates blockage of a top air vent of an electronic device.

FIG. 3 illustrates blockage of a top air vent of an electronic device 300.

In FIG. 3, the electronic device 300 includes an enclosure 302. A processor executes instructions 311 stored in memory 312. The electronic device 300 may also include a temperature sensor 314. Temperature sensor 314 may be used to determine whether the temperature inside the enclosure 302 exceeds a threshold or whether a specific device, e.g., processor 310, fan 330, communication device 316, etc., begins to overheat and exceeds a temperature threshold. However, the electronic device 300 may not include a temperature sensor 314. A communication device 316 may be used to communicate with a service provider, a gateway/cable modem/router, and/or a user device. Communication device 316 may provide wired communication or wireless communication. For example, communication device 316 may support a wireless connection in accordance with any IEEE 802.11 Wi-Fi protocols, Bluetooth protocols, Bluetooth Low Energy (BLE), or other short-range protocols that operate in accordance with a wireless technology standard for exchanging data over short distances using any licensed or unlicensed band such as the citizens broadband radio service (CBRS) band, 2.4 GHz bands, 5 GHz bands, 6 GHz bands, 60 GHz, etc. Additionally, communication device 316 can support a wireless connection that operates in accordance with, but is not limited to, Radio Frequency for Consumer Electronics (RF4CE) protocol, ZigBee protocol, Z-Wave protocol, or IEEE 802.15.4 protocol. It is also contemplated by the present disclosure that connections 560, 562 can include connections to a media over coax (MoCA) network. Communication device 316 may also support a wired Ethernet connection.

Communication device 316 may also be connected to a network, which may include a wide area network (WAN), a virtual private network (VPN), metropolitan area networks (MANs), system area networks (SANs), a DOCSIS (Data Over Cable Service Interface Specification) network, a fiber optics network (e.g., FTTH (fiber to the home) or FTTX (fiber to the x), or hybrid fiber-coaxial (HFC)), a digital subscriber line (DSL), a public switched data network (PSDN), a global Telex network, or a 2G, 3G, 4G or 5G network, for example. Communication device 316 may further be connected with a service provider through a broadband mobile phone network connection, an optical network connection, or other similar connections. For example, communication device 316 can also be implemented using a fixed wireless connection that operates in accordance with, but is not limited to, 3rd Generation Partnership Project (3GPP) Long Term Evolution (LTE) or 5G protocols.

The enclosure 302 may include one or more air vents, such as top vent 320 and bottom vent 322. Top vent 320 may be an exhaust vent and bottom vent 322 may be an intake vent. However, one or more air vents 320, 322 may be provided on each side of enclosure 302, on a same side of enclosure 302, only on the top or bottom of enclosure 302. Enclosure 302 may include feet 324 to raise enclosure so that air may enter through bottom vent 322.

The electronic device 100 may include one or more fans 330. Fan 330 may draw air in 332 through the bottom vent 322 and push air out 334 of top vent 320. Alternatively, fan 330 may include a first to draw air in 332 through the bottom vent 322 and a second fan may be used to push air out 334 of top vent 320.

A proximity sensor 340 is used to determine when the one or more air vents 320, 322 are blocked. For example, in FIG. 3 proximity sensor emits a sensing signal 342 toward the top air vent 320. Sensing signal 342 may be any type of signal, such as sound, light, infrared radiation (IR), or an electromagnetic field. However, top vent 320 is blocked by a cat 370 laying over the top air vent 320. Instead of a cat, top air vent 320 may be blocked when a newspaper or magazine is placed over top air vent 320. Alternatively, air flow through top air vent 320, as well as bottom air vent 322 may be obstructed when the electronic device 300 is placed in a narrow enclosure 372, such as in a cabinet or short shelf. Proximity sensor 340 may determine whether the top vent 320 is blocked based on a reflection of sensing signal 342, which may be visible, IR, sound, etc. Detection may also be based on proximity sensor 340 measuring a first energy level when the one or more air vents are not blocked and a second energy level greater than a predetermined value when the one or more air vents are blocked. Also, as stated above, one or more air vents 320, 322 may be provided on each side of enclosure 302, on a same side of enclosure 302, only on the top or bottom of enclosure 302, and a proximity sensors 340 may be configured to detect blockage of the one or more air vents 320, 322 regardless of their location. Accordingly, proximity sensor 340 provides an indication to processor 310 that the one or more air vents 320, 322 are blocked.

When proximity sensor 340 detects an air vent is blocked, processor 310 may determine how long the air vent 320 has been blocked. For example, the air vent 320 may only be blocked for a short period of time, such as when a user temporarily places a magazine over air vent 320. If the air vent 320 is not blocked for a long time, e.g., a predetermined time period, electronic device 300 should not issue a notification because the blockage may be removed before damage to, or degradation of the device occurs. However, when the air vent 320 is blocked for a longer period of time, e.g., a time that exceeds a predetermined period of time, the electronic device sends a notification for the service provider or for a user device.

Like the electronic device 100, 200 illustrated in FIGS. 1-2, the electronic device 300 of FIG. 3 includes a bus 350 that connects processor 310, memory 312, temperature sensor 314, communication device 316, fan 330 and proximity sensor 340. Processor 310 may thus control operation of temperature sensor 314, communication device 316, fan 330 and proximity sensor 340.

Figure 4:
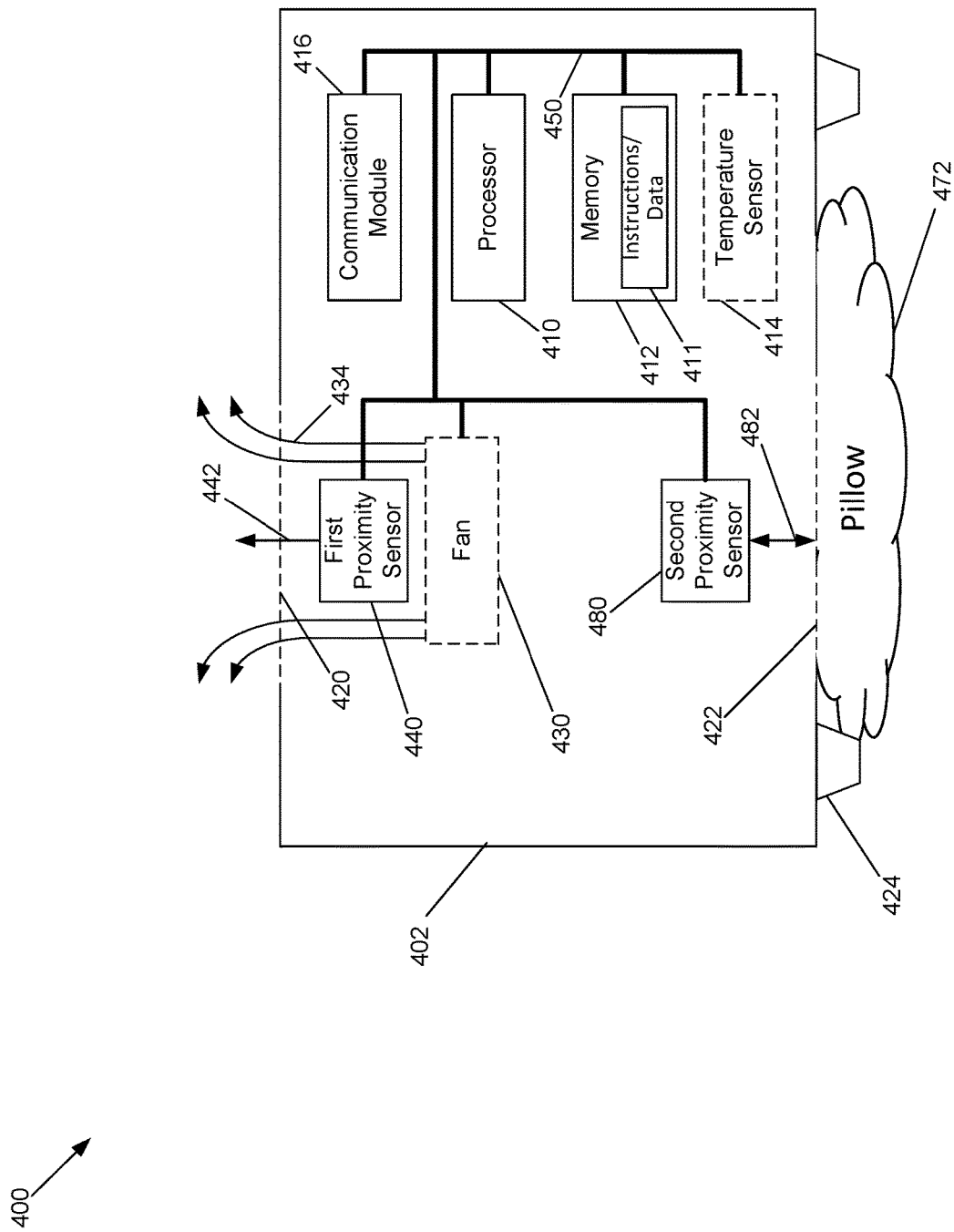
FIG. 4 illustrates blockage of a bottom air vent of an electronic device.

FIG. 4 illustrates blockage of a bottom air vent of an electronic device 400.

In FIG. 4, the electronic device 400 includes an enclosure 402. A processor executes instructions 411 stored in memory 412. The electronic device 400 may also include a temperature sensor 414. Temperature sensor 414 may be used to determine whether the temperature inside the enclosure 402 exceeds a threshold or whether a specific device, e.g., processor 410, fan 430, communication device 416, etc., begins to overheat and exceeds a temperature threshold. However, the electronic device 400 may not include a temperature sensor 414.

A communication device 416 may be used to communicate with a service provider, a gateway/cable modem/router, and/or a user device. Communication device 416 may provide wired communication or wireless communication. For example, communication device 416 may support a wireless connection in accordance with any IEEE 802.11 Wi-Fi protocols, Bluetooth protocols, Bluetooth Low Energy (BLE), or other short-range protocols that operate in accordance with a wireless technology standard for exchanging data over short distances using any licensed or unlicensed band such as the citizens broadband radio service (CBRS) band, 2.4 GHz bands, 5 GHz bands, 6 GHz bands, 60 GHz, etc. Additionally, communication device 416 can support a wireless connection that operates in accordance with, but is not limited to, Radio Frequency for Consumer Electronics (RF4CE) protocol, ZigBee protocol, Z-Wave protocol, or IEEE 802.15.4 protocol. It is also contemplated by the present disclosure that connections 560, 562 can include connections to a media over coax (MoCA) network. Communication device 416 may also support a wired Ethernet connection.

Communication device 416 may also be connected to a network, which may include a wide area network (WAN), a virtual private network (VPN), metropolitan area networks (MANs), system area networks (SANs), a DOCSIS (Data Over Cable Service Interface Specification) network, a fiber optics network (e.g., FTTH (fiber to the home) or FTTX (fiber to the x), or hybrid fiber-coaxial (HFC)), a digital subscriber line (DSL), a public switched data network (PSDN), a global Telex network, or a 2G, 3G, 4G or 5G network, for example. Communication device 416 may further be connected with a service provider through a broadband mobile phone network connection, an optical network connection, or other similar connections. For example, communication device 416 can also be implemented using a fixed wireless connection that operates in accordance with, but is not limited to, 3rd Generation Partnership Project (3GPP) Long Term Evolution (LTE) or 5G protocols.

The enclosure 402 may include one or more air vents, such as top vent 420 and bottom vent 422. Top vent 420 may be an exhaust vent and bottom vent 422 may be an intake vent. However, one or more air vents 420, 422 may be provided on each side of enclosure 402, on a same side of enclosure 402, only on the top or bottom of enclosure 402. Enclosure 402 may include feet 424 to raise enclosure so that air may enter through bottom vent 422. The electronic device 100 may include one or more fans 430. Fan 430 may draw air in 432 through the bottom vent 422 and push air out 434 of top vent 420. Alternatively, fan 430 may include a first fan to draw air in 432 through the bottom vent 422 and a second fan to push air out 434 of top vent 420.

In FIG. 4, a first proximity sensor 440 is used to determine when the top air vent 420 is blocked. FIG. 4 also illustrates a second proximity sensor 480 that is used to determine when the bottom air vent 422 is blocked. For example, in FIG. 4 first proximity sensor 440 emits a sensing signal 442 toward the top air vent 420 and second proximity sensor 480 emits a sensing signal 482 toward the bottom air vent 422. Sensing signals 442, 482 may be any type of signal, such as sound, light, infrared radiation (IR), or an electromagnetic field.

However, bottom vent 422 is blocked by a pillow 472 that the electronic device 400 has been placed on. Instead of bottom vent 422 being blocked by a pillow 472, bottom air vent 422 may be blocked when a newspaper or magazine is placed under bottom top air vent 422. Proximity sensor 480 may determine whether the bottom air vent 422 is blocked based on a reflection of sensing signal 482, which may be visible, IR, sound, etc. Detection may also be based on proximity sensor 480 measuring a first energy level when the bottom top air vent 422 is not blocked and a second energy level greater than a predetermined value when the bottom top air vent 422 is blocked. Also, as stated above, one or more air vents 420, 422 may be provided on each side of enclosure 402, on a same side of enclosure 402, only on the top or bottom of enclosure 402, and proximity sensors 440, 480 may be configured to detect blockage of the one or more air vents 420, 422 regardless of their location. Accordingly, proximity sensor 440 provides an indication to processor 410 that the one or more air vents 420, 422 are blocked.

When proximity sensor 480 detects an air vent is blocked, processor 410 may determine how long the air vent 422 has been blocked. For example, the air vent 422 may only be blocked for a short period of time, such as when a user temporarily places a magazine under air vent 422. If the air vent 422 is not blocked for a long time, e.g., a predetermined time period, electronic device 400 should not issue a notification because the blockage may be removed before damage to, or degradation of the device occurs. However, when the air vent 422 is blocked for a longer period of time, e.g., a time that exceeds a predetermined period of time, the electronic device sends a notification for the service provider or for a user device.

Electronic device 400 of FIG. 4 may also include a bus 450 that connects processor 410, memory 412, temperature sensor 414, communication device 416, fan 430 and proximity sensor 440. Processor 410 may thus control operation of temperature sensor 414, communication device 416, fan 430 and proximity sensors 440, 480.

Figure 5:
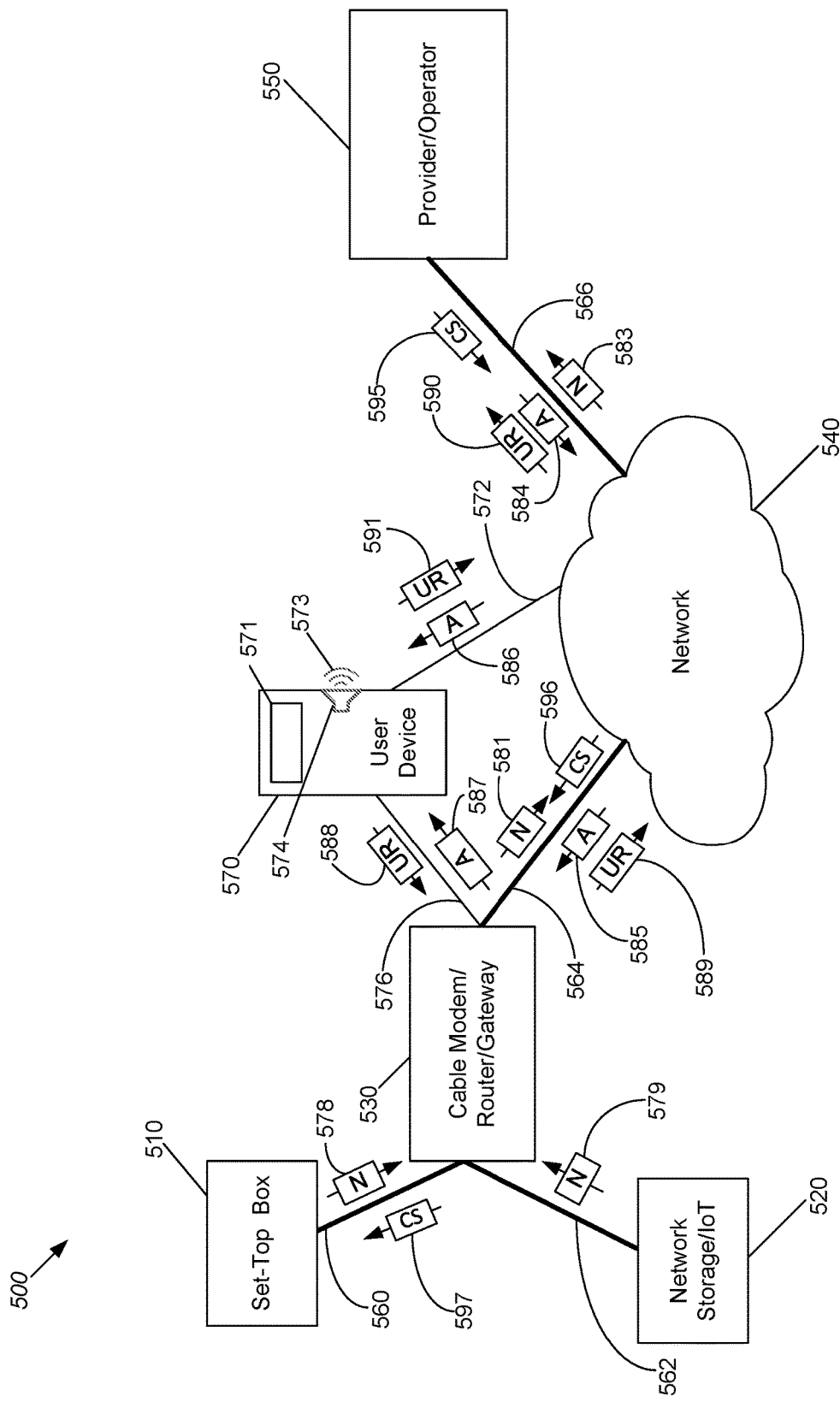
FIG. 5 illustrates notification messaging by an electronic device in a network.

FIG. 5 illustrates notification messaging by an electronic device in a network 500.

In FIG. 5, a set-top box 510 and network storage/IoT device 520 are coupled to a gateway 530. Network storage/IoT device 520 may be any network device that may include sensors, software, and other technologies for the purpose of connecting and exchanging data with other devices and systems over the Internet. For example, network storage 520 provides file-based data storage services to other devices on the network, and configured over the network, often using a browser. Network storage 520 contain one or more hard disk drives, often arranged into logical, redundant storage containers or RAID. Examples of IoT devices 520 may include smart mobiles, connected appliances such as refrigerators and microwaves, smart watches, fire alarms, smart door lock, medical sensors, fitness trackers, security systems, biometric cybersecurity scanners, etc. Gateway 530 may be coupled to service provider 550 through network 540. Gateway 530 may also communicate with a user device 570. Gateway 530 can be, for example, a hardware electronic device that may be a combination modem and gateway device that combines the functions of a cable modem, an access point, and/or a router for providing content received from the service provider 550 to network devices (e.g., set-top box 510 and network storage/IoT devices 520 in the system.

Gateway 530 may use a wired or wireless connection to communicate with set-top box 510 using connection 560, network storage/IoT device 520 using connection 562, service provider 550 through network 540 using connections 564, 566, and user device 570 using connection 576. For example, connections 560, 562, 576 may include a wireless connection in accordance with any IEEE 802.11 Wi-Fi protocols, Bluetooth protocols, Bluetooth Low Energy (BLE), or other short-range protocols that operate in accordance with a wireless technology standard for exchanging data over short distances using any licensed or unlicensed band such as the citizens broadband radio service (CBRS) band, 2.4 GHz bands, 5 GHz bands, 6 GHz bands, 60 GHz, etc. Additionally, connections 560, 562, 576 can be implemented using a wireless connection that operates in accordance with, but is not limited to, Radio Frequency for Consumer Electronics (RF4CE) protocol, ZigBee protocol, Z-Wave protocol, or IEEE 802.15.4 protocol. It is also contemplated by the present disclosure that connections 560, 562, 576 can include connections to a media over coax (MoCA) network. One or more of connections 560, 562, 576 can also be a wired Ethernet connection.

Gateway 530 may use connection 564 to access network 540, which may include a wide area network (WAN), a virtual private network (VPN), metropolitan area networks (MANs), system area networks (SANs), a DOCSIS (Data Over Cable Service Interface Specification) network, Dual Stack Lite (DSLite) network, a fiber optics network (e.g., FTTH (fiber to the home) or FTTX (fiber to the x), or hybrid fiber-coaxial (HFC)), a digital subscriber line (DSL), a public switched data network (PSDN), a global Telex network, or a 2G, 3G, 4G or 5G network, for example.

Connections 564, 566, 572 can include as some portion thereof a broadband mobile phone network connection, an optical network connection, or other similar connections. For example, Connections 564, 566, 572 can also be implemented using a fixed wireless connection that operates in accordance with, but is not limited to, 3rd Generation Partnership Project (3GPP) Long Term Evolution (LTE) or 5G protocols. Connections 564, 566, 572 can further include DOCSIS, DSLite, MoCA, or other coax or fiber optic connection.

In FIG. 5, electronic devices, e.g., set-top box 510 and network storage/IoT device 520, may detect a blocked air vent using a proximity sensor as described above. Set-top box 510 and network storage/IoT device 520 may also detect an overheat condition if a temperature sensor is included. Set-top box 510 and network storage/IoT device 520 may then send a notification 578, 579 to gateway 530. Gateway 530 may forward the notification 581 through network 540 to service provider 550.

Service provider 550 may issue an alert message 584 that is sent to network 540. Network 540 sends alert message 585 to the gateway 530. Gateway 530 provides the alert message 587 to user device 570. Alternatively, service provider 550 may send the alert message 586 to user device 570 through network 540 using connection 572. For example, service provider 550 may use a mobile phone network to send a voice message or a text message using a short message service (SMS). The information in the alert message 586 or alert message 587 may be presented on a display 571. Alternatively the alert message 586 or alert message 587 may trigger an audio warning 573 using speaker 574. The user may provide a user response 588 to the gateway 530. The user response may indicate the issue has been resolved by moving whatever was blocking an air vent at the set-top box 510 and/or network storage/IoT device 562. The user may check the air vent and cause a user response 588 that alternatively indicates that the air vent is not blocked. The user response 588 may also be a snooze response to give the user additional time to have the air vents checked. For example, the user may not be at home and need to contact someone at home to check on the air vent, or the user may need additional time to check the air vent. The gateway 530 may then forward the user response 589 through the network 540 where the user response 590 is provided to the service provider 550. User device 570 may instead send a user response 591 to network 540. The service provider 550 may clear the blockage event identified by the notification 583 or initiate an action in response to the user response 590.

If the service provider 550 does not receive the user response 587 within a predetermined time, the service provider 550 may also initiate an action. An action initiated by the service provider 550 may include sending a control signal 595 through network 540. Gateway 530 receives control signal 596 and sends the control signal 597 to set-top box 510, for example, to shut down, to increase the speed of a fan, to decrease power usage, or to perform other measures to prevent the electronic device (e.g., set-top box 510) from overheating.

Figure 6:
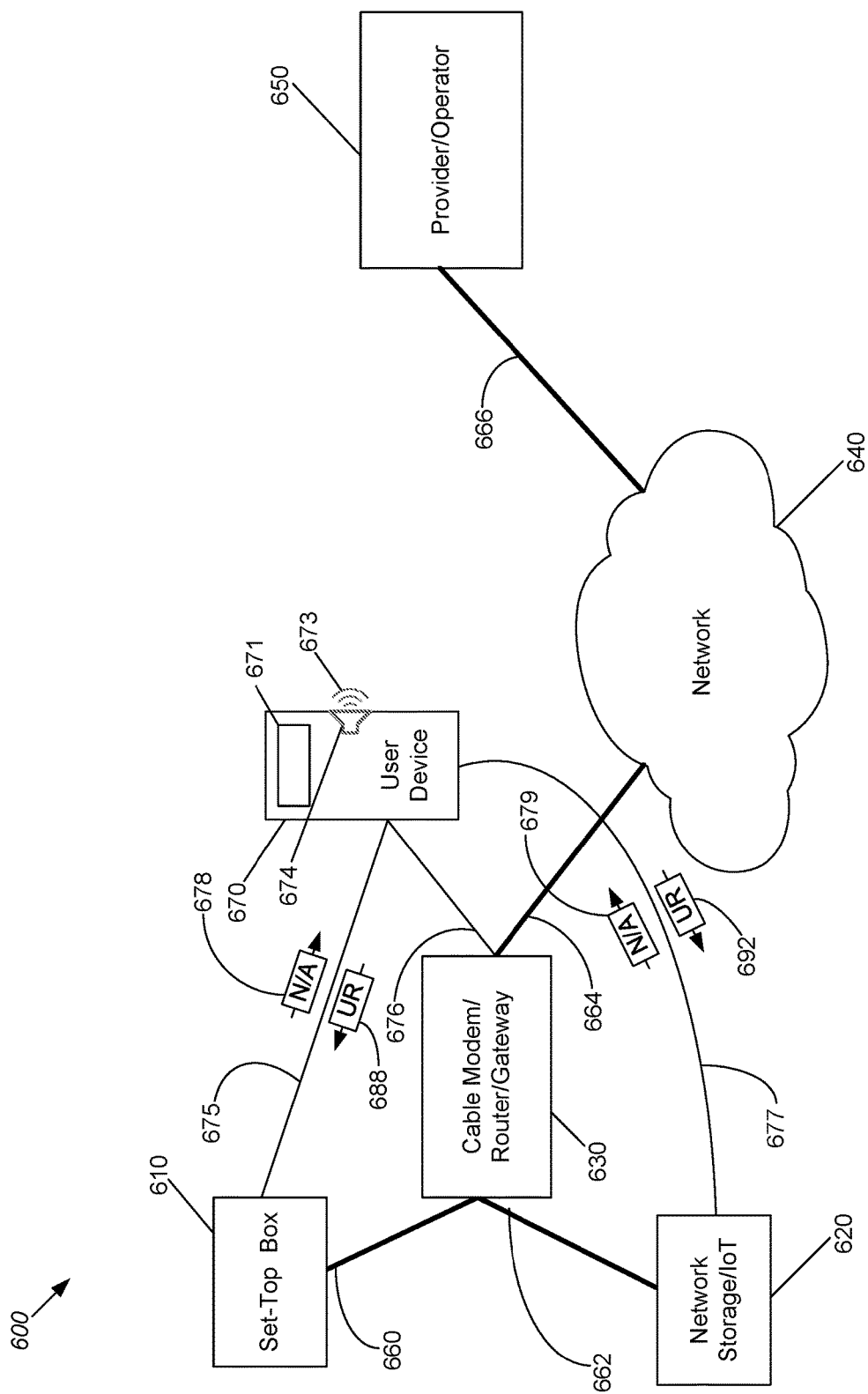
FIG. 6 illustrates notification messaging form an electronic device to a user device.

FIG. 6 illustrates notification messaging form an electronic device to a user device 600.

In FIG. 6, a set-top box 610 and network storage/IoT device 620 are coupled to a gateway 630. Gateway 630 may be coupled to service provider 650 through network 640. Gateway 630 may also communicate with a user device 670 using connection 676. Set-top box 610 may use connection 675 to communicate with user device 670. Network storage/IoT device 620 may use connection 677 to communicate with user device 670. As described with reference to FIG. 5, similar wired or wireless connections may be used for communication between components, e.g., set-top box 610, network storage/IoT device 620, gateway 630, service provider 650, and user device 670. Likewise, connections 660, 662, 664, 666, 675, 676, 677 and network 640 may be implemented as described with similar connections and network described with reference to FIG. 5.

In FIG. 6, electronic devices, e.g., set-top box 610 and network storage/IoT device 620, may detect a blocked air vent using a proximity sensor as described above. Set-top box 610 and network storage/IoT device 620 may also detect an overheat condition if a temperature sensor is included. Set-top box 610 and network storage/IoT device 620 may then send a notification 678, 679 directly to user device 670. For example, an electronic device, such as set-top box 610 and network storage/IoT device 620 may not be able to communicate with service provider 650, or in the case of network storage/IoT device 620, a service provider 650 may not be associated with network storage/IoT device 620. Notification 678, 679 may also include alert information describing a blocked air vent event. The information in the notification/alert message 678, 679 may be presented on a display 671. Alternatively, the notification/alert message 678, 679 may trigger an audio warning 673 using speaker 674. The user may provide a user response 688, 692 from user device 670 to set-top box 610 and network storage/IoT device 620, respectively.

The user response 688, 692 may indicate the issue has been resolved by moving whatever was blocking an air vent at the set-top box 610 and/or network storage/IoT device 620. The user may check the air vent and cause user response 688, 692 that alternatively indicates that the air vent is not blocked. User response 688, 692 may also be a snooze response to give the user additional time to have the air vents checked. For example, the user may not be at home and need to contact someone at home to check on the air vent, or the user may need additional time to check the air vent.

The set-top box 610 and/or network storage/IoT device 620 may clear the blockage event identified by the notification/alert message 678, 679 or initiate an action in response to the user response 688, 692. If the user response 688, 692 is not received within a predetermined time, the set-top box 610 and/or network storage/IoT device 620 may also initiate an action. An action initiated by the set-top box 610 and/or network storage/IoT device 620 may include shutting down, increasing the speed of a fan, decreasing power usage, or performing other measures to prevent the electronic device (e.g., set-top box 610) from overheating.

Figure 7:
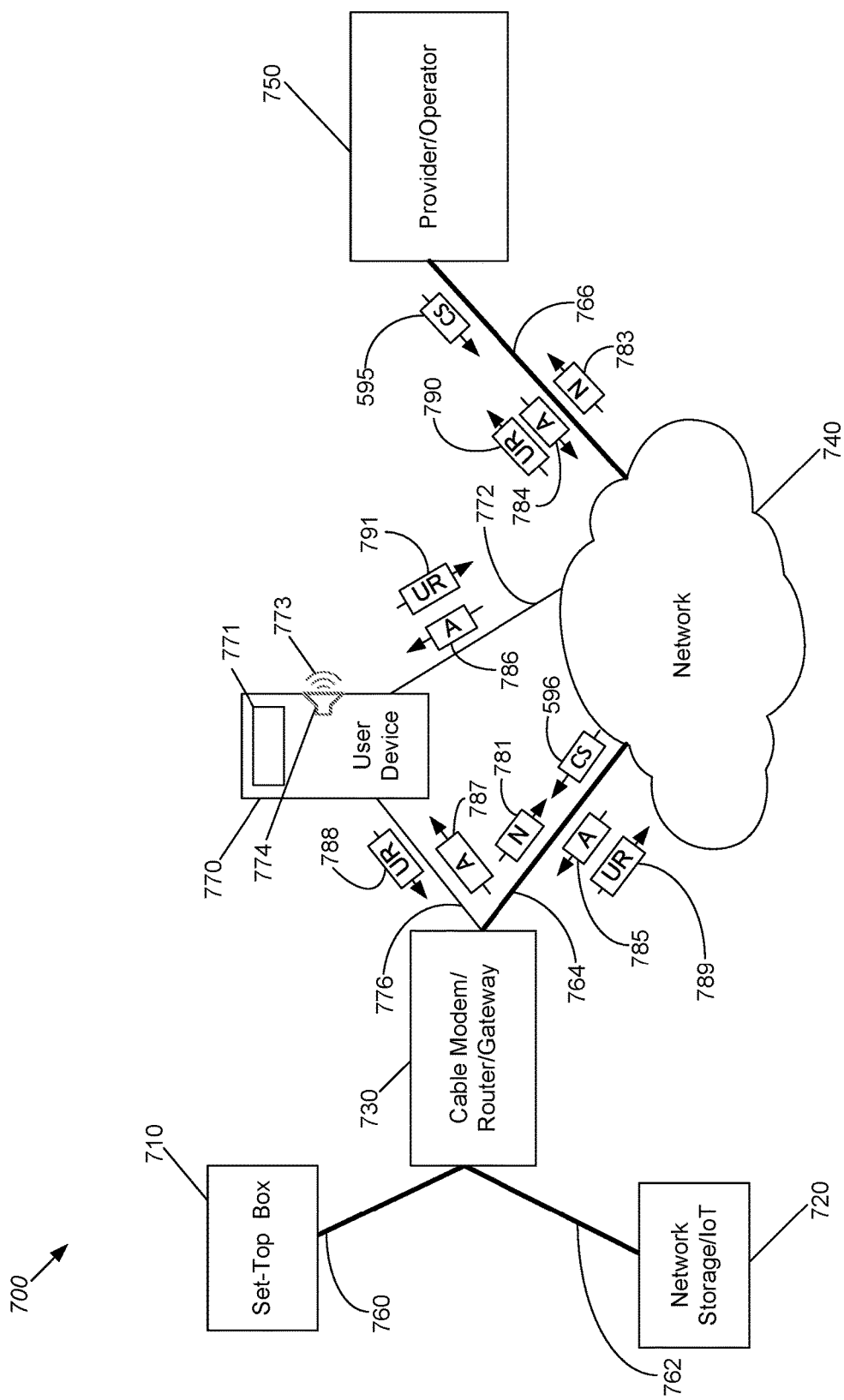
FIG. 7 illustrates notification messaging from a gateway.

FIG. 7 illustrates notification messaging from a gateway 700.

In FIG. 7, a set-top box 710 and network storage/IoT device 720 are coupled to a gateway 730. Gateway 730 may be coupled to service provider 750 through network 740. Gateway 730 and service provider 750 may also communicate with a user device 770. As described with reference to FIG. 5, similar wired or wireless connections may be used for communication between components, e.g., set-top box 710, network storage/IoT device 720, gateway 730, service provider 750, and user device 770. Likewise, connections 760, 762, 764, 766, 772, 776 and network 740 may be implemented as described with similar connections and network described with reference to FIG. 5.

In FIG. 7, an electronic device, e.g., gateway 730, may detect a blocked air vent using a proximity sensor as described above. Gateway 730 may also detect an overheat condition if a temperature sensor is included. Gateway 730 may then send a notification 781 through network 740. Notification 783 is provided from the network 740 to service provider 750. Service provider 750 sends an alert message 784 to network 740. The alert message 785 may be forwarded from the network 740 to gateway 730. Gateway 740 then forwards the alert message 787 to user device 770. Instead of providing the alert message 785 to gateway 730, service provider 750 may provide alert message 786 to user device 770 using connection 772. Connection 772 can include as some portion thereof a broadband mobile phone network connection, an optical network connection, or other similar connections. For example, Connection 772 can also be implemented using a fixed wireless connection that operates in accordance with, but is not limited to, 3rd Generation Partnership Project (3GPP) Long Term Evolution (LTE) or 5G protocols. Connections 772 can further include DOCSIS, DSLite, MoCA, or other coax or fiber optic connection.

The information in the alert message 787, 786 may be presented on a display 771. Alternatively, alert message 787, 786 may trigger an audio warning 773 using speaker 774. The user may provide a user response 788 to gateway 730. Gateway 730 may provide the user response 789 to network 740. Instead of providing user response 788 to gateway 730, user device 770 may provide user response 791 to network 740. Network 740 provides user response 790 to service provider 750. Service provider 750 determines whether a user response has been received within a predetermined time. When the service provider 750 determines that a time allowed for receiving a user response has not expired, the service provider 750 continues to wait for user response 790.

When the service provider 750 determines that a temperature event or an air vent blockage event has been addressed, the service provider 750 continues to monitor the electronic device for temperature events and air vent blockage events. When the service provider 750 determines that the temperature event or the air vent blockage event has not been addressed, the service provider 750 determines whether the alert should be repeated. When the service provider 750 determines that the alert should be repeated, the service provider 750 resends alert 784 and waits for a user response.

The user response 788, 791 may indicate the issue has been resolved by moving whatever was blocking an air vent at gateway 730. The user may check the air vent and cause user response 788, 791 that alternatively indicates that the air vent is not blocked. User response 788, 791 may also be a snooze response to give the user additional time to have the air vents checked. For example, the user may not be at home and need to contact someone at home to check on the air vent, or the user may need additional time to check the air vent.

The service provider 750 may clear the blockage event identified by notification 783 or initiate an action in response to the user response 790. If the user response 790 is not received by service provider 750 within a predetermined time, service provider 750 may initiate an action. An action initiated by service provider 750 may include shutting down, increasing the speed of a fan, decreasing power usage, or performing other measures to prevent the electronic device (e.g., gateway 730) from overheating.

Figure 8:
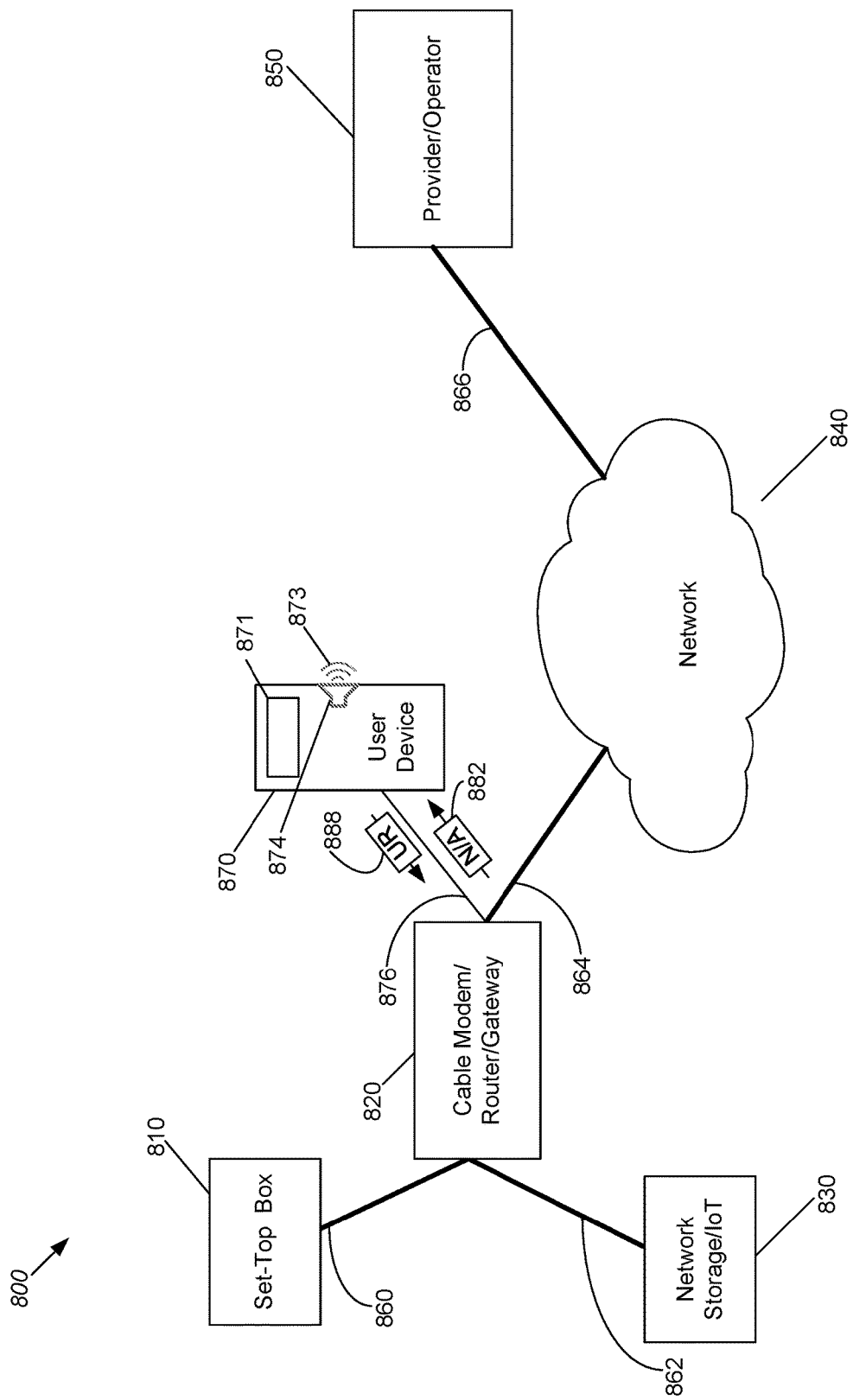
FIG. 8 illustrates notification messaging directly to a user device from a gateway.

FIG. 8 illustrates notification messaging directly to a user device from a gateway 800.

In FIG. 8, a set-top box 810 and network storage/IoT device 820 are coupled to a gateway 830. Gateway 830 may be coupled to service provider 850 through network 840. Gateway 830 may also communicate with a user device 870. As described with reference to FIG. 5, similar wired or wireless connections may be used for communication between components, e.g., set-top box 810, network storage/IoT device 820, gateway 830, service provider 850, and user device 870. Likewise, connections 860, 862, 864, 866, 876 and network 840 may be implemented as described with similar connections and network described with reference to FIG. 5.

In FIG. 8, an electronic device, e.g., gateway 820, may detect a blocked air vent using a proximity sensor as described above. Gateway 830 may also detect an overheat condition if a temperature sensor is included. Gateway 830 may then send a notification 882 directly to user device 870 using connection 876. For example, gateway 830 may not be in communication with service provider 850. Notification 882 may also include alert information describing the air vent blockage or overheating event.

The alert information in notification 882 may be presented on a display 871. Alternatively, notification/alert 882 may trigger an audio warning 873 using speaker 874. The user may provide a user response 888 to gateway 830. The user response 888 may indicate the issue has been resolved by moving whatever was blocking an air vent at gateway 830. The user may check the air vent and cause user response 888 that alternatively indicates that the air vent is not blocked. User response 888 may also be a snooze response to give the user additional time to have the air vents checked. For example, the user may not be at home and need to contact someone at home to check on the air vent, or the user may need additional time to check the air vent.

The blockage event identified at gateway 830 by notification/alert 882 may be cleared by the user, or the gateway 830 may initiate an action in response to the user response 888. If the user response 888 is not received by gateway 830 within a predetermined time, gateway 830 may initiate an action. An action initiated by gateway 830 may include shutting down, increasing the speed of a fan, decreasing power usage, or performing other measures to prevent the electronic device (e.g., gateway 830) from overheating.

Figure 9:
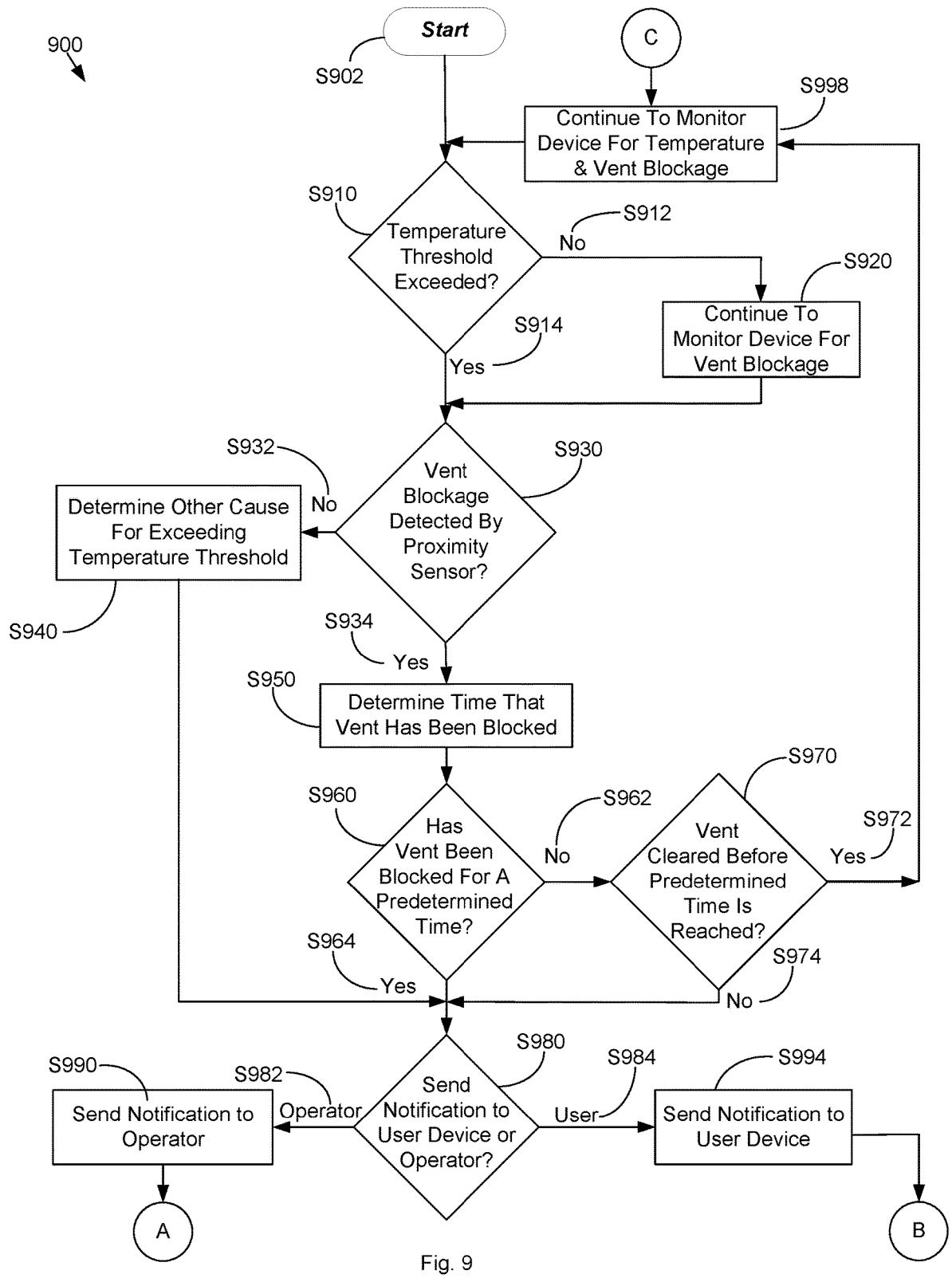
FIGS. 9-10 illustrate a flow chart of a method for handling blocked air vent for electronic devices indicated by a proximity sensor.
Figure 10:
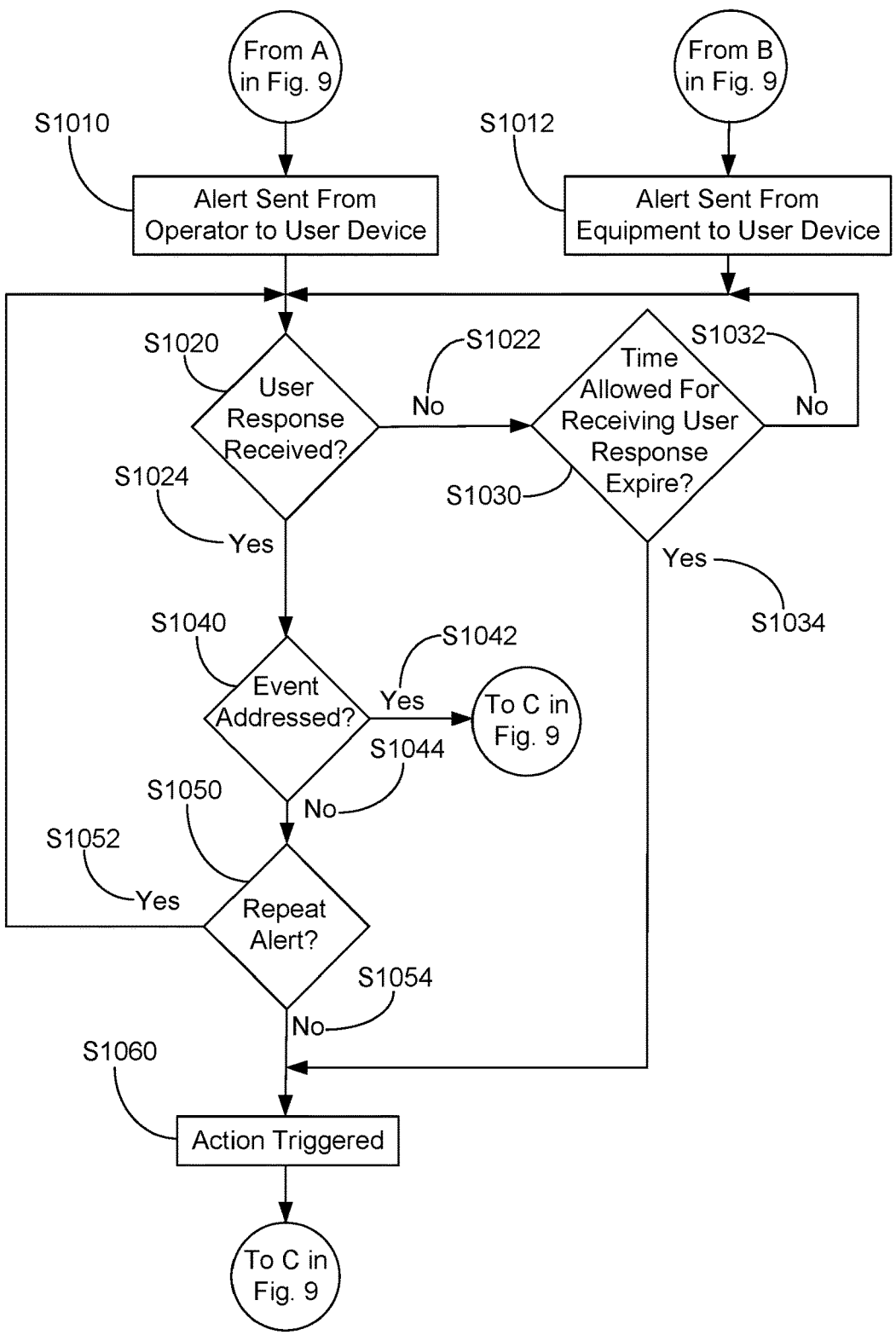

FIGS. 9-10 illustrate a flow chart of a method for handling blocked air vent for electronic devices indicated by a proximity sensor 900.

In FIG. 9 a temperature measurement provided by a temperature sensor is analyzed to determine if the temperature measurement exceeds a threshold (S910). Referring to FIG. 1, a temperature sensor 114 may be used to determine whether the temperature inside the enclosure 102 exceeds a threshold or whether a specific device, e.g., processor 110, fan 130, communication device 116, etc., begins to overheat and exceeds a temperature threshold.

If a temperature sensor is not provided, or if the temperature measurement does not exceed the temperature threshold (S912), the electronic device continues to monitor for blockage of an air vent using a proximity sensor (S920). Referring to FIG. 1 a proximity sensor 140 is used to determine when the one or more air vents 120, 122 are blocked. For example, in FIG. 1 proximity sensor emits a sensing signal 142 toward the top air vent 120. Because top vent 120 is not blocked, proximity sensor 140 does not provide an indication to processor 110 that the one or more air vents 120, 122 are blocked.

When the temperature measurement exceeds the temperature threshold (S914), and when the electronic device continues to monitor for blockage of an air vent (S920), a determination is made whether a proximity sensor detects an air vent is blocked (S930).

Referring to FIG. 3, a proximity sensor 340 is used to determine when the one or more air vents 320, 322 are blocked. For example, in FIG. 3 proximity sensor emits a sensing signal 342 toward the top air vent 320. Sensing signal 342 may be any type of signal, such as sound, light, infrared radiation (IR), or an electromagnetic field. However, top vent 320 is blocked by a cat 370 laying over the top air vent 320. Instead of a cat, top air vent 320 may be blocked when a newspaper or magazine is placed over top air vent 320. Alternatively, air flow through top air vent 320, as well as bottom air vent 322 may be obstructed when the electronic device 300 is placed in a narrow enclosure 372, such as in a cabinet or short shelf. Proximity sensor 340 may determine whether the top vent 320 is blocked based on a reflection of sensing signal 342, which may be visible, IR, sound, etc. Detection may also be based on proximity sensor 340 measuring a first energy level when the one or more air vents are not blocked and a second energy level greater than a predetermined value when the one or more air vents are blocked.

Referring to FIG. 4, In FIG. 4, a first proximity sensor 440 is used to determine when the top air vent 420 is blocked. FIG. 4 also illustrates a second proximity sensor 480 that is used to determine when the bottom air vent 422 is blocked. For example, in FIG. 4 first proximity sensor 440 emits a sensing signal 442 toward the top air vent 420 and second proximity sensor 480 emits a sensing signal 482 toward the bottom air vent 422. Sensing signals 442, 482 may be any type of signal, such as sound, light, infrared radiation (IR), or an electromagnetic field.

However, bottom vent 422 is blocked by a pillow 472 that the electronic device 400 has been placed on. Instead of bottom vent 422 being blocked by a pillow 472, bottom air vent 422 may be blocked when a newspaper or magazine is placed under bottom top air vent 422. Proximity sensor 480 may determine whether the bottom air vent 422 is blocked based on a reflection of sensing signal 482, which may be visible, IR, sound, etc. Detection may also be based on proximity sensor 480 measuring a first energy level when the bottom top air vent 422 is not blocked and a second energy level greater than a predetermined value when the bottom top air vent 422 is blocked.

When the proximity sensor determines that an air vent is not blocked (S932), other causes for exceeding the temperature threshold are examined (S940). Referring to FIG. 1, other causes for exceeding the temperature threshold are examined when proximity sensor 140 does not provide an indication to processor 110 that the one or more air vents 120, 122 are blocked.

When a proximity sensor detects an air vent is blocked (S934), the time the vent has been blocked is determined (S950). A determination is then made to determine if the vent has been blocked for a predetermined time (S960). When the vent has not been blocked for a predetermined time (S962), a determination is made whether the vent has been cleared before the predetermined time is reached (S970). When the vent has been cleared before the predetermined time is reached (S972), the method loops back to continue to monitor the electronic device for temperature and vent blockage events (S998). When the vent has not been cleared before the predetermined time is reached (S974), the vent has been blocked for a predetermined time (S964), or after other causes for exceeding the temperature threshold hold are examined (S940), a determination is made to send a notification to the user device or to the service provider/operator (S980).

Referring to FIG. 3, when proximity sensor 340 detects an air vent is blocked, processor 310 may determine how long the air vent 320 has been blocked. For example, the air vent 320 may only be blocked for a short period of time, such as when a user temporarily places a magazine over air vent 320. If the air vent 320 is not blocked for a long time, e.g., a predetermined time period, electronic device 300 should not issue a notification because the blockage may be removed before damage to, or degradation of the device occurs. However, when the air vent 320 is blocked for a longer period of time, e.g., a time that exceeds a predetermined period of time, the electronic device sends a notification for the service provider or for a user device.

Referring to FIG. 4, when proximity sensor 480 detects an air vent is blocked, processor 410 may determine how long the air vent 422 has been blocked. For example, the air vent 422 may only be blocked for a short period of time, such as when a user temporarily places a magazine under air vent 422. If the air vent 422 is not blocked for a long time, e.g., a predetermined time period, electronic device 400 should not issue a notification because the blockage may be removed before damage to, or degradation of the device occurs. However, when the air vent 422 is blocked for a longer period of time, e.g., a time that exceeds a predetermined period of time, the electronic device sends a notification for the service provider or for a user device.

When the notification is to be sent to the operator (S982), a notification is sent to the operator (S990). Referring to FIG. 7, an electronic device, e.g., gateway 720, may detect a blocked air vent using a proximity sensor as described above. Gateway 730 may also detect an overheat condition if a temperature sensor is included. Gateway 730 may then send a notification 781 through network 740. Notification 783 is provided from the network 740 to service provider 750.

When the notification is to be sent to the user device (S984), a notification is sent to the user device (S994). Referring to FIG. 8, an electronic device, e.g., gateway 820, may detect a blocked air vent using a proximity sensor as described above. Gateway 830 may also detect an overheat condition if a temperature sensor is included. Gateway 830 may then send a notification 882 directly to user device 870 using connection 876. For example, gateway 830 may not be in communication with service provider 850. Notification 882 may also include alert information describing the air vent blockage or overheating event.

The process continues as illustrated in FIG. 10.

When the notification is sent to the operator (S990), an alert is sent from the operator to the user device (S1010). Service provider 750 sends an alert message 784 to network 740. The alert message 785 may be forwarded from the network 740 to gateway 730. Gateway 740 then forwards the alert message 782 to user device 770. Instead of providing the alert message 785 to gateway 730, service provider 750 may provide alert message 786 to user device 770 using connection 772.

When the notification is sent to the user device (S994), an alert is sent from the electronic device to the user device (S1010). Referring to FIG. 8, gateway 830 may then send a notification 882 directly to user device 870 using connection 876. For example, gateway 830 may not be in communication with service provider 850. Notification 882 may also include alert information describing the air vent blockage or overheating event.

Next, a determination is made whether a user response has been received (S1020). When a user response has not been received (S1022), a determination is made whether a time allowed for receiving a user response has expired (S1030). When a time allowed for receiving a user response has not expired (S1032), the process continues to wait for a user response (S1020). When a time allowed for receiving a user response has expired (S1034), the process branches to trigger an action (S1060).

Referring to FIG. 7, service provider 750 determines whether a user response has been received within a predetermined time. When the service provider 750 determines that a time allowed for receiving a user response has not expired, the service provider 750 continues to wait for user response 790.

If the user response 790 is not received by service provider 750 within a predetermined time, service provider 750 may initiate an action. An action initiated by service provider 750 may include shutting down, increasing the speed of a fan, decreasing power usage, or performing other measures to prevent the electronic device (e.g., gateway 730) from overheating.

When a user response is received (S1024), a determination is made whether the temperature event or the air vent blockage event has been addressed (S1040). Referring to FIG. 7, the user response 788, 791 may indicate the issue has been resolved by moving whatever was blocking an air vent at gateway 730. The user may check the air vent and cause user response 788, 791 that alternatively indicates that the air vent is not blocked. User response 788, 791 may also be a snooze response to give the user additional time to have the air vents checked. For example, the user may not be at home and need to contact someone at home to check on the air vent, or the user may need additional time to check the air vent.

When the temperature event or the air vent blockage event has been addressed (S1042), the process loops back to the beginning to continue to monitor the electronic device for temperature events and air vent blockage events (S998). When the temperature event or the air vent blockage event has not been addressed (S1042), a determination is made whether the alert should be repeated (S1050). When it is determined that the alert should be repeated (S1052), the process loops back to determine whether a user response has been received (S1020).

Referring to FIG. 7, service provider 750 determines whether a user response has been received within a predetermined time. When the service provider 750 determines that a time allowed for receiving a user response has not expired, the service provider 750 continues to wait for user response 790.

When the service provider 750 determines that a temperature event or an air vent blockage event has been addressed, the service provider 750 continues to monitor the electronic device for temperature events and air vent blockage events. When the service provider 750 determines that the temperature event or the air vent blockage event has not been addressed, the service provider 750 determines whether the alert should be repeated. When the service provider 750 determines that the alert should be repeated, the service provider 750 resends alert 784 and waits for a user response.

When it is determined that the alert should not be repeated (S1054), an action is triggered (S1060). Referring to FIG. 5, if the service provider 550 does not receive the user response 587 within a predetermined time, the service provider 550 may also initiate an action. An action initiated by the service provider 550 may include sending a control signal 595 through network 540. Gateway 530 receives control signal 596 and sends the control signal 597 to set-top box 510, for example, to shut down, to increase the speed of a fan, to decrease power usage, or to perform other measures to prevent the electronic device (e.g., set-top box 510) from overheating.

Then, the process loops back to the beginning to continue to monitor the electronic device for temperature events and air vent blockage events (S998).

The processes discussed in this disclosure may be implemented in hardware, software, or a combination thereof. In the context of software, the described operations represent computer-executable instructions stored on one or more computer-readable storage media that, when executed by one or more hardware processors, perform the recited operations. Generally, computer-executable instructions include routines, programs, objects, components, data structures, and the like that perform particular functions or implement particular abstract data types. Those having ordinary skill in the art will readily recognize that certain steps or operations illustrated in the figures above may be eliminated, combined, or performed in an alternate order. Any steps or operations may be performed serially or in parallel. Furthermore, the order in which the operations are described is not intended to be construed as a limitation.

The subject matter of the present disclosure may be provided as a computer program product including one or more non-transitory computer-readable storage media having stored thereon instructions (in compressed or uncompressed form) that may be used to program a computer (or other electronic device) to perform processes or methods described herein. The computer-readable storage media may include one or more of an electronic storage medium, a magnetic storage medium, an optical storage medium, a quantum storage medium, or the like. For example, the computer-readable storage media may include, but are not limited to, hard drives, floppy diskettes, optical disks, read-only memories (ROMs), random access memories (RAMs), erasable programmable ROMs (EPROMs), electrically erasable programmable ROMs (EEPROMs), flash memory, magnetic or optical cards, solid-state memory devices, or other types of physical media suitable for storing electronic instructions.

Further, the subject matter of the present disclosure may also be provided as a computer program product including a transitory machine-readable signal (in compressed or uncompressed form). Examples of machine-readable signals, whether modulated using a carrier or unmodulated, include, but are not limited to, signals that a computer system or machine hosting or running a computer program may be configured to access, including signals transferred by one or more networks. For example, a transitory machine-readable signal may comprise transmission of software by the Internet.

Separate instances of these programs can be executed on or distributed across any number of separate computer systems. Thus, although certain steps have been described as being performed by certain devices, software programs, processes, or entities, this need not be the case. A variety of alternative implementations will be understood by those having ordinary skill in the art.

Additionally, those having ordinary skill in the art readily recognize that the techniques described above can be utilized in a variety of devices, environments, and situations. Although the subject matter has been described in language specific to structural features or methodological acts, it is to be understood that the subject matter defined in the appended claims is not necessarily limited to the specific features or acts described. Rather, the specific features and acts are disclosed as exemplary forms of implementing the claims.

What is claimed is:

1. An electronic device, comprising:
    an enclosure having one or more air vents;
    at least one proximity sensor disposed within the enclosure proximate the one or more air vents, the at least one proximity sensor generating a sensing signal to detect blockage of the one or more air vents, and, based on a response to the sensing signal, generating an output signal indicating blockage of the one or more air vents is detected;
    a memory, disposed within the enclosure, storing computer-readable instructions; and
    a processor, disposed within the enclosure, configured to execute the computer-readable instructions to:
        receive the output signal from the proximity sensor indicating blockage of the one or more air vents is detected;
        in response to receiving the output signal from the proximity sensor indicating blockage of the one or more air vents is detected, forward to a service provider, a notification of the blockage of the one or more air vents;
        receive an alert from the service provider describing information about the one or more air vents being blocked;
        forward the alert to a user device including instructions associated with checking the one or more air vents; and
        receive, in response to the alert, a user response from the user device indicating the blockage associated with the one or more air vents has been resolved.

2. The electronic device of claim 1, further comprising a fan for circulating air to cool the inside of the enclosure, wherein the one or more air vents comprising an intake vent and an exhaust vent, the at least one proximity sensor comprising a first proximity sensor proximate to the intake vent and a second proximity sensor proximate the exhaust vent, the fan pulling air in through the intake vent and pushing air out of the exhaust vent, and wherein the processor receives the output signal from one of the first proximity sensor detecting blockage of the intake vent and the second proximity sensor detecting blockage of the exhaust vent.

3. The electronic device of claim 1, wherein:
    the processor further sending the notification to the user device, wherein the notification comprises alert information.

4. The electronic device of claim 1, wherein the processor forwards the user response to the service provider.

5. The electronic device of claim 1, wherein when the processor fails to receive the user response within a predetermined time, the processor initiates a cooling action until the output signal from the proximity sensor indicates the one or more air vents are no longer blocked.

6. The electronic device of claim 1 further comprising a temperature sensor, wherein the notification further includes information associated with one or more of an internal temperature that exceeds a first predetermined temperature threshold measured within the enclosure by the temperature sensor and a temperature of a component within the enclosure measured by the temperature sensor that exceeds a second predetermined temperature threshold.

7. The electronic device of claim 1, wherein the notification is forwarded using one or more of a Wi-Fi signal forwarded over a Wi-Fi network, a radio frequency (RF) signal forwarded over an RF network, an RF satellite signal forwarded through a communication satellite, a POST request message forwarded over a network to a destination address, and a JSON (JavaScript Object Notation) message forwarded over the network to the destination address.

8. A method of detecting blockage of a vent in an enclosure of an electronic device, comprising:
generating, by at least one proximity sensor, a sensing signal to detect blockage of one or more air vents;
based on a response to the sensing signal, generating, by the at least one proximity sensor, at least one output signal indicating blockage of the one or more air vents is detected;
in response to the at least one output signal, generated by the proximity sensor, forwarding, to a service provider, a notification of the blockage of the one or more air vents;
receiving an alert from the service provider describing information about the one or more air vents being blocked;
forwarding the alert to a user device including instructions associated with checking the one or more air vents; and
receiving, in response to the alert, a user response from the user device indicating the blockage associated with the one or more air vents has been resolved.

9. The method of claim 8, wherein the generating, by at least one proximity sensor, the sensing signal further comprise generating a first sensing signal from a first proximity sensor to detect blockage of an intake vent, and generating a second sensing signal from a second proximity sensor to detect blockage of an exhaust vent, wherein a fan is used to pull air in through the intake vent and to push air out of the exhaust vent, and wherein, based on a first response to the first sensing signal, a first output signal is generated indicating blockage of the intake vent, and, based on a second response to the second sensing signal, a second output signal is generated indicating blockage of the exhaust vent.

10. The method of claim 8, wherein:
sending the notification to the user device, wherein the notification comprises alert information.

11. The method of claim 1 further comprises forwarding the user response to the service provider when the alert is received from the service provider.

12. The method of claim 1 further comprises determining that the user response is not received within a predetermined time, and, in response to the user response not being received within the predetermined time, initiating cooling actions until the output signal from the proximity sensor indicates the one or more air vents are no longer blocked.

13. The method of claim 8 further comprising determining temperature information by determining at least one of an internal temperature that exceeds a first predetermined temperature threshold measured within the enclosure by a temperature sensor and a temperature of a component within the enclosure measured by the temperature sensor that exceeds a second predetermined temperature threshold, wherein the generating the notification further comprises including the temperature information in the notification.

14. The method of claim 8, wherein, when the notification is forwarded to the service provider, forwarding, from the service provider to a user device, an alert describing information about the one or more air vents being blocked, receiving at the service provider a user response from the user device indicating the blockage associated with the one or more air vents has been resolved.

15. A non-transitory computer-readable media having computer-readable instructions stored thereon, which when executed by a processor causes the processor to perform operations comprising:
generating, by at least one proximity sensor, a sensing signal to detect blockage of one or more air vents in an enclosure;
based on a response to the sensing signal, generating, by the at least one proximity sensor, at least one output signal indicating blockage of the one or more air vents is detected;
in response to the at least one output signal, generated by the proximity sensor, forwarding, to a service provider, a notification of the blockage of the one or more air vents;
receiving an alert from the service provider describing information about the one or more air vents being blocked;
forwarding the alert to a user device including instructions associated with checking the one or more air vents;
receiving, in response to the alert, a user response from the user device indicating the blockage associated with the one or more air vents has been received.

16. The non-transitory computer-readable media of claim 15, wherein the generating, by at least one proximity sensor, the sensing signal further comprise generating a first sensing signal from a first proximity sensor to detect blockage of an intake vent, and generating a second sensing signal from a second proximity sensor to detect blockage of an exhaust vent, wherein a fan is used to pull air in through the intake vent and to push air out of the exhaust vent, and wherein, based on a first response to the first sensing signal, a first output signal is generated indicating blockage of the intake vent, and, based on a second response to the second sensing signal, a second output signal is generated indicating blockage of the exhaust vent.

17. The non-transitory computer-readable media of claim 15, wherein:
sending the notification to the user device, wherein the notification comprises alert information.

18. The non-transitory computer-readable media of claim 1 further comprises receiving a user response from the user device indicating the blockage associated with the one or more air vents has been resolved, and forwarding the user response to the service provider when the alert is received from the service provider.

19. The non-transitory computer-readable media of claim 1 further comprises determining that the user response is not received within a predetermined time, and, in response to the user response not being received within the predetermined time, initiating cooling actions until the output signal from the proximity sensor indicates the one or more air vents are no longer blocked.

20. The non-transitory computer-readable media of claim 15 further comprising determining temperature information by determining at least one of an internal temperature that exceeds a first predetermined temperature threshold measured within the enclosure by a temperature sensor and a temperature of a component within the enclosure measured by the temperature sensor that exceeds a second predetermined temperature threshold, wherein the generating the notification further comprises including the temperature information in the notification.

\* \* \* \* \*